United States Patent
Yang et al.

(10) Patent No.: US 11,333,322 B2
(45) Date of Patent: May 17, 2022

(54) BACKLIGHT MODULE AND MANUFACTURING METHOD THEREOF

(71) Applicant: WUHAN CHINA STAR OPTOELECTRONICS TECHNOLOGY CO., LTD., Hubei (CN)

(72) Inventors: Yong Yang, Hubei (CN); Fancheng Liu, Hubei (CN); Chunhung Huang, Hubei (CN); Guowei Zha, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 139 days.

(21) Appl. No.: 16/632,437

(22) PCT Filed: Nov. 8, 2019

(86) PCT No.: PCT/CN2019/116721
§ 371 (c)(1),
(2) Date: Jan. 20, 2020

(87) PCT Pub. No.: WO2021/017270
PCT Pub. Date: Feb. 4, 2021

(65) Prior Publication Data
US 2021/0404630 A1     Dec. 30, 2021

(30) Foreign Application Priority Data
Jul. 31, 2019 (CN) .......................... 201910700897.1

(51) Int. Cl.
*F21V 9/30*     (2018.01)
*F21V 8/00*     (2006.01)

(52) U.S. Cl.
CPC .............. *F21V 9/30* (2018.02); *G02B 6/0088* (2013.01)

(58) Field of Classification Search
CPC ................................ F21V 9/30; G02B 6/0088
See application file for complete search history.

(56) References Cited

FOREIGN PATENT DOCUMENTS

| CN | 108535916 A | * | 9/2018 |
|----|-------------|---|--------|
| CN | 108732817 A | * | 11/2018 |
| CN | 109387981 A | * | 2/2019 |
| CN | 109387981 A |   | 2/2019 |
| CN | 109613758 A |   | 4/2019 |
| CN | 110061116 A |   | 7/2019 |

* cited by examiner

*Primary Examiner* — Mary Ellen Bowman

(57) ABSTRACT

The present disclosure provides a backlight module and a method of manufacturing the backlight module. Through splicing a light panel on a reinforcing plate and fixing with a double-sided tape, and then performing a membrane pressure press or a casting process to the backlight module, forms a fluorescent film of mini-LED as a whole surface structure, in a bid to prevent waveguide blocking light in propagation of the fluorescent film, thereby improving a problem of splicing dark line.

10 Claims, 3 Drawing Sheets

BACKLIGHT MODULE AND MANUFACTURING METHOD THEREOF

FIELD OF INVENTION

The present disclosure relates to the field of backlight technologies, and more particularly, to a backlight module and manufacturing method thereof.

BACKGROUND OF INVENTION

As a direct-type display backlight source, mini light-emitting diode (mini-LED) has many advantages such as high brightness, high contrast, regional dimming display, deformable shape, narrow border, etc., and has become a focus.

However, due to consideration of cost and thickness, the use of mini-LEDs on small-sized displays has been unable to meet market expectations of price, and has insufficient benefit. For medium-sized car display and e-sports display, the advantages of mini-LEDs are prominent, and can be used to achieve high brightness and high contrast of the display. However, due to a limitation of size of current machines, most of the medium-sized mini-LED samples cannot realize one-time molding of the whole plate. At the same time, the die bonding machine also needs to consider size and mass production efficiency in the design of the size of the workpiece. It is impossible to infinitely enlarge the size of die bonding, which leads to the splicing of the majority of samples in the molding of the backlight module. Thus, for splicing backlight, a relatively obvious splicing gap is easily generated, and a splicing dark line on the display is difficult to eliminate, thereby affecting the image quality of the display.

Therefore, it is necessary to propose a solution to the problems in the prior art.

SUMMARY OF INVENTION

The purpose of the present disclosure is to provide a backlight module and a method of manufacturing the backlight module that can solve the problems in the prior art.

In order to solve the above problems, the present disclosure provides a backlight module and a manufacturing method thereof, by splicing a light panel on a reinforcing plate and fixing it with a double-sided tape, and then performing a membrane pressure press or a casting process on the backlight module, forming the fluorescent film of the mini-LED as a whole surface structure, to avoid the waveguide blocking light in the propagation of the fluorescent film, thereby improving the problem of dark line of splicing.

According to an aspect of the present disclosure, an embodiment of the present disclosure provides a backlight module, including: a reinforcing plate; at least one light panel disposed on the reinforcing plate; a plurality of chips disposed on the at least one light panel; and a fluorescent film covering the plurality of chips and the at least one light panel.

Furthermore, the at least one light panel is a splice plate.

According to an aspect of the present disclosure, the present disclosure provides a method of manufacturing a backlight module, including: providing at least one light panel;

fixing a plurality of chips on the at least one light panel; disposing the at least one light panel on which the plurality of chips are fixed on a reinforcing plate; forming a fluorescent film on the at least one light panel and the plurality of chips to forming a backlight panel; and processing the backlight panel.

Furthermore, the plurality of chips are fixed on the at least one light panel by a reflow process and a casting process.

Furthermore, the step of fixing a plurality of chips on the at least one light panel further includes cutting the at least one light panel.

Furthermore, the cutting is a one-sided cutting, and performed by cutter wheel cutting or a laser cutting.

Furthermore, the at least one light panel is a splice plate and is spliced to the reinforcing plate by an adhesive.

Furthermore, the adhesive includes a double-sided tape.

Furthermore, the fluorescent film is formed on the at least one light panel and the plurality of chips by a membrane pressure press or a casting process.

Furthermore, the processing includes: baking the backlight panel formed by the fluorescent film; and cutting the backlight panel.

Compared with the prior art, embodiments of the present disclosure, through splicing a light panel on a reinforcing plate and fixing it with a double-sided tape, and then performing a membrane pressure press or a casting process on the backlight module, form the fluorescent film of the mini-LED as a whole surface structure, in a bid to prevent the waveguide blocking light in the propagation of the fluorescent film, thereby improving the problem of splicing dark line.

DETAILED DESCRIPTION OF PREFERRED EMBODIMENTS

Figure 1:
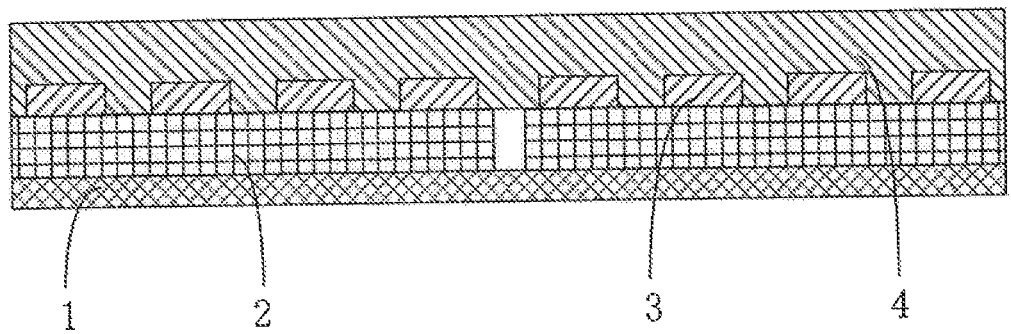
FIG. 1 is a schematic structural diagram of a backlight module according to an embodiment of the present disclosure.

The technical solutions in the embodiments of the present disclosure will be clearly and completely described in the following with reference to the accompanying figures in the embodiments, It is apparent that the described embodiments are only a part of the embodiments of the present disclosure, and not all of them. All other embodiments obtained by those skilled in the art based on the embodiments of the present disclosure without departing from the inventive steps are in the scope of the present disclosure.

The terms "first", "second", "third", etc. (if present) in the specification and claims of the present disclosure and the above figures are used to distinguish similar objects, and are not necessarily used to describe order or prioritization, It can be understood that the objects described are interchangeable when appropriate. In addition, the intention of the terms "including" and "having" and any variants thereof is to cover inclusions of non-exclusive.

The figures, which are discussed below, and the various embodiments used to describe the principles of the present disclosure are intended to be illustrative only and not to limit the scope of the present disclosure. Those skilled in the art will realize that the principles of the present disclosure may be implemented in any suitably arranged system. Exemplary embodiments will be described in detail, examples of which are illustrated in the accompanying figures. Further, a terminal according to an exemplary embodiment will be described in detail with reference to the accompanying figures. The same reference numerals in the drawings denote the same elements.

The terms used in the description of the present disclosure are only used to describe specific embodiments, not intended to show the concepts of the present disclosure. Unless the context clearly has a different meaning, otherwise, the expression used in the singular encompasses the plural form of expression. In the present disclosure, it can be understood that terms such as "including", "having", and "containing" are intended to illustrate that the possibilities of the features, the numbers, the steps, the acts, or combinations thereof disclosed in the present disclosure, not intended to exclude the possibility that one or more other features, numbers, steps, acts or combinations may be added.

As shown in FIG. 1, an embodiment of the present disclosure provides a backlight module including at least one light panel 1, a plurality of chips 2, a reinforcing plate 3, and a fluorescent film 4.

At least one light panel 1 is disposed on the reinforcing plate 3. In this embodiment, at least one of the light panel 1 is a splice plate, and the reinforcing plate 3 serves as reinforcement and support, so that the at least one light panel 1 can complete the splicing work on the reinforcing plate 3 first. At least one light panel 1 is fixed on the reinforcing plate 3 by an adhesive. Specifically, the adhesive includes, but is not limited to, a double-sided tape.

The plurality of chips 2 are disposed on the at least one light panel 1. The plurality of chips 2 are fixed on the at least one light panel 1 by performing a die bonding operation using a die bonding adhesive, the die bonding adhesive includes a conductive adhesive and an insulating adhesive. Specifically, the conductive adhesive may be a silver adhesive, and the insulating adhesive may be a transparent adhesive. An adhesive film thickness is 0.1-0.15 mm, and is mainly used to fix the chips.

The die bonding is also called die bond or die attach. The die bonding is a process of bonding the chip to a designated area of the stent by the die bonding adhesive, forming a heat path or an electrical path, to provide a condition for the subsequent wire bonding.

The fluorescent film 4 covers the plurality of chips 2 and at the least one light panel 1. A thickness of the fluorescent film 4 is 0.15 to 0.4 mm, and it comprises phosphor and an optically clear adhesive (OCA). The optically clear adhesive and the phosphor are mixed to form a fluorescent film sheet 20. The fluorescent film 4 is formed by a full-surface film coating method to ensure the consistency of the fluorescent film 4 at the joint seam and peripheral non-splicing area. Since the uniformity of the whole surface of the fluorescent film 4 is better, it is therefore ensured that the light emitted from the plurality of chips 2 is uniformly conducted in the fluorescent film 4. Especially, light transmission is not blocked at the joint seam, thereby preventing from the problem of angle selectivity of light emitted from cross-section caused by the blocking of the fluorescent film 4 in the conventional splicing method. Since the light is uniformly transmitted in the entire fluorescent film 4, the light at different angles on the surface of the film layer is relatively uniform, thereby preventing the occurrence of a dark line phenomenon.

Figure 2:
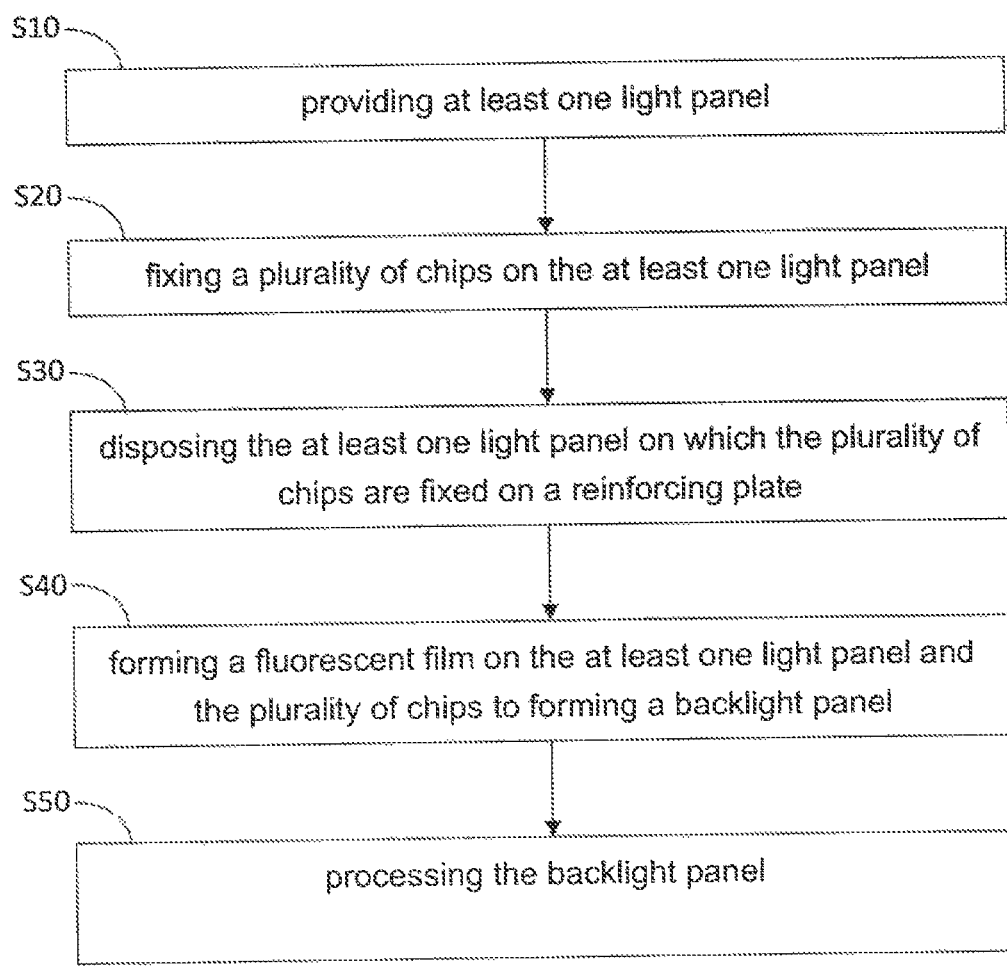
FIG. 2 is a schematic flowchart of a method of manufacturing a backlight module according to an embodiment of the present disclosure.

As shown in FIG. 2, an embodiment of the present disclosure provides a method of manufacturing a backlight module, which includes the following steps.

Figure 3:
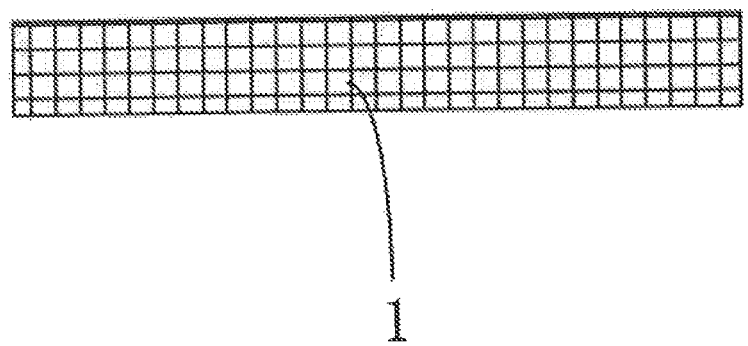
FIG. 3 to FIG. 7 are schematic diagrams showing a formation of a backlight module according to an embodiment of the present disclosure.

In step S10, providing at least one light panel 1, as shown in FIG. 3

In an embodiment of the present disclosure, the at least one light panel is a splice plate.

Figure 4:
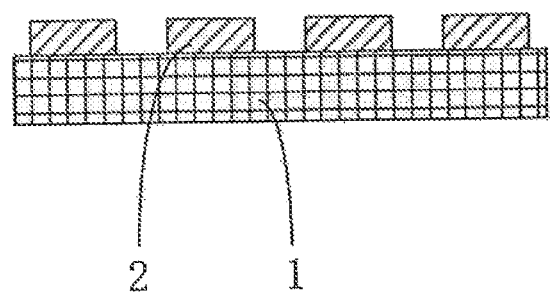

In step S20, fixing a plurality of chips 2 on the at least one light panel 1, as shown in FIG. 4.

In the embodiment of the present disclosure, processing a die bonding operation to the plurality of chips 2 on the at least one light panel 1, ensuring an entire surface of the light panel is illuminated and has brightness uniformity by a reflow process, and coating an adhesive layer having 0.1-0.15 mm thickness by a casting process to fix the plurality of chips 2, thereby preventing damage caused by subsequent pre-cutting process to chip bonding.

The plurality of chips 2 are fixed on the at least one light panel 1 by the die bonding operation, and the die bonding is also called die bond or die attach. The die bonding is a process of bonding the chip to a designated area of the stent by the die bonding adhesive to form a heat path or an electrical path, and provides a condition for the subsequent wire bonding. The die bonding adhesive includes a conductive adhesive and an insulating adhesive. The specific conductive adhesive may be a silver adhesive, and the insulating adhesive may be a transparent adhesive. In the embodiment of the present disclosure, a thickness of the adhesive film is 0.1 to 0.15 mm.

The reflow process refers to using a solder paste (a mixture of solder and soldering flux) to connect one or more electronic component to the contact pads, and then melting the solder to achieve permanent bonding by controlling the heating. Different heating methods such as using a furnace, an infrared heating lamp, or a heat gun may be used for soldering. In the embodiment of the present disclosure, a plurality of chips 2 are soldered to the at least one light panel 1.

The casting process is a plastic film production process that plasticizes and melts the raw material through an extruder, extrudes through a T-shaped structural modeling die, casts into a roll on a surface of a smooth rotating cooling roll, cools and shapes the film on the cooling roll, and then wounds the product by pulling and trimming. The film blank of the film forming method is in the form of a sheet. The film blank of a cast film is cooled and shaped on the cooling roll. The cast film has neither longitudinal stretching nor transverse stretching during extrusion casting, cooling and shaping. The film formed by the casting method has uniform thickness, good transparency and heat sealability.

After completing the process of fixing the plurality of chips 2, one-sided cutting the splicing edge of the at least one light panel 1, and performing the cutting by cutter wheel cutting or laser cutting, to ensure the cutting precision is favorable for the subsequent splicing process.

Figure 5:
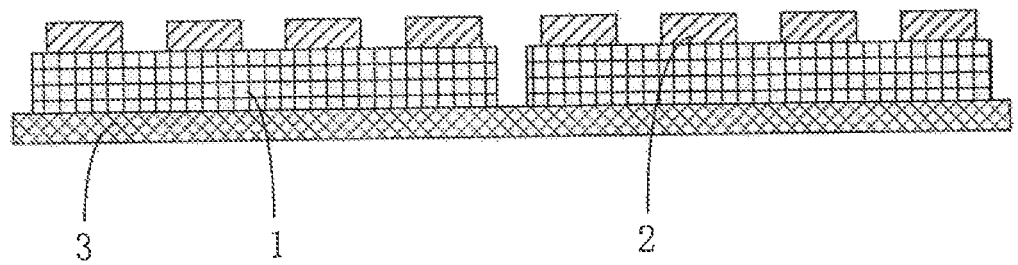

In step S30, disposing the at least one light panel 1 on which the plurality of chips 2 are fixed on a reinforcing plate 3, as shown in FIG. 5.

In an embodiment of the present disclosure, splicing the at least one light panel 1 on which the plurality of chips 2 are fixed on the reinforcing plate 3, and splicing by a laser marking alignment mode to ensure the precision of the seam of splicing is not greater than 50 micrometers. The at least one light panel 1 is fixed to the reinforcing plate 3 by an adhesive. Specifically, the adhesive includes, but is not limited to, a double-sided tape.

Figure 6:
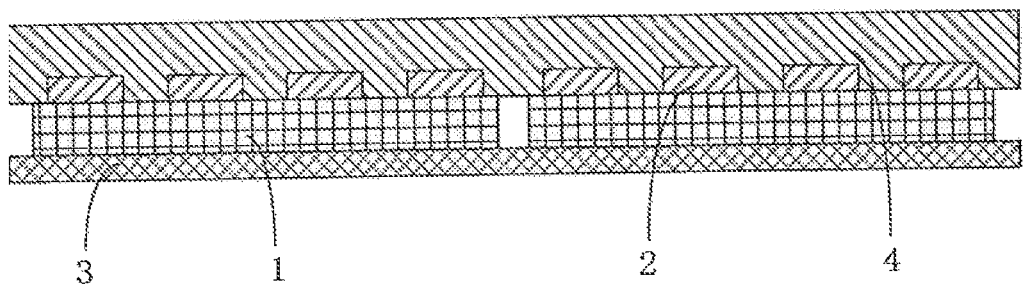

Step S40, forming a fluorescent film on the at least one light panel and the plurality of chips to forming a backlight panel, as shown in FIG. 6.

In an embodiment of the present disclosure, the fluorescent film 4 is formed on the at least one light panel 1 and the plurality of chips 2 by a membrane pressure press or a casting process. Specifically, the process is selected according to the size of the backlight module. In this embodiment of the present disclosure, the membrane pressure press is preferentially selected. A thickness of the fluorescent film 4 is 0.15 to 0.4 mm, and the fluorescent film 4 comprises a phosphor and an optically transparent adhesive. The optically transparent adhesive and the phosphor are mixed to form a fluorescent film sheet 20. The optically transparent adhesive is preferably an optically clear adhesive (OCA). The fluorescent film 4 is formed by a full-surface film coating method to ensure the consistency of the fluorescent film 4 at the joint seam and peripheral non-splicing area. Since the uniformity of the whole surface of the fluorescent film 4 is better, it is therefore ensured that the light emitted from the plurality of chips 2 is uniformly conducted in the fluorescent film 4. Especially, light transmission is not blocked at the joint seam, thereby preventing the problem of angle selectivity of the light emitted from the cross-section caused by the blocking of the fluorescent film 4 in the conventional splicing method. Since the light is uniformly transmitted in the entire fluorescent film 4, the light at different angles on the surface of the film layer is relatively uniform, thereby preventing the occurrence of a dark line phenomenon.

Figure 7:
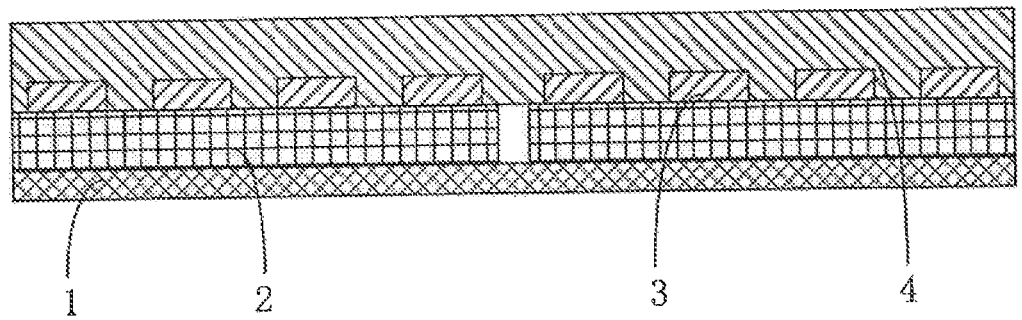

In step S50, processing the backlight panel, as shown in FIG. 7.

In an embodiment of the present disclosure, the processing includes baking the backlight module formed by the fluorescent film, and performing a cutting process on the backlight module.

The baking process is specifically performed by baking the backlight module in an oven for 2-3 hours, and baking at a temperature greater than 120 Celsius degrees. In this embodiment, selecting 150 Celsius degrees, and after completing the baking, achieving a better bonding effect between the two coating layers, thereby preventing the occurrence of degumming.

The specific operation of the cutting process includes cutting the four sides of the backlight module according to a preset cutting position to form a complete mini-LED light panel backlight module.

In the embodiments of the present disclosure, through splicing a light panel on a reinforcing plate and fixing it with a double-sided tape, and then performing a membrane pressure press or a casting process to the backlight module, the fluorescent film of the mini-LED as a whole surface structure is formed, in a bid to prevent the waveguide blocking light in the propagation of the fluorescent film, thereby improving the problem of splicing dark line.

The backlight module and the manufacturing method thereof are provided in detail in the above embodiments. The principles and implementations of the present disclosure are described in the following. The description of the above embodiments is only used to help to understand the method of the present disclosure and its core idea, at the same time, for those skilled in the art, according to the idea of the present disclosure, there will be changes in the specific implementation and application scope. In summary, the content of this specification should not be understood as limiting the present disclosure.

INDUSTRIAL APPLICABILITY

The present disclosure can be manufactured and used in the industry with industrial applicability.

What is claimed is:

1. A backlight module, comprising:
   a reinforcing plate;
   light panel light panels disposed on the reinforcing plate, wherein a joint seam is defined between adjacent ones of the light panels;
   a plurality of chips disposed on the light panels; and
   a fluorescent film covering the plurality of chips and the light panels, wherein a lateral space between adjacent ones of the chips at the joint seam between the light panels is provided only with the fluorescent film.

2. The backlight module as claimed in claim 1, wherein each of the light panels is a splice plate.

3. A method of manufacturing a backlight module, comprising:
   providing light panels, wherein a joint seam is defined between adjacent ones of the light panels;
   fixing a plurality of chips on the light panels;
   disposing the light panels on which the plurality of chips are fixed on a reinforcing plate;
   forming a fluorescent film on the light panels and the plurality of chips to form a backlight panel, wherein a lateral space between adjacent ones of the chips at the joint seam between the light panels is provided only with the fluorescent film; and
   processing the backlight panel.

4. The method of manufacturing the backlight module as claimed in claim 3, wherein the plurality of chips are fixed on the light panels by a reflow process and a casting process.

5. The method of manufacturing the backlight module as claimed in claim 3, wherein the step of fixing the plurality of chips on the light panels further comprise cutting the light panels.

6. The method of manufacturing the backlight module as claimed in claim 5, wherein the cutting is a one-sided cutting, and performed by cutter wheel cutting or laser cutting.

7. The method of manufacturing the backlight module as claimed in claim 3, wherein each of the light panels is a splice plate and is spliced to the reinforcing plate by an adhesive.

8. The method of manufacturing the backlight module as claimed in claim 7, wherein the adhesive comprises a double-sided tape.

9. The method of manufacturing the backlight module as claimed in claim 3, wherein the fluorescent film is formed on the light panels and the plurality of chips by a membrane pressure press or a casting process.

10. The method of manufacturing the backlight module as claimed in claim 3, wherein the processing comprises:
    baking the backlight module formed by the fluorescent film; and
    cutting the backlight module.

* * * * *